United States Patent [19]

Rosen et al.

[11] Patent Number: 4,469,929
[45] Date of Patent: Sep. 4, 1984

[54] METHOD FOR SECURING OPTICAL AND ELECTRO-OPTICAL COMPONENTS

[75] Inventors: Hans-Georg Rosen, Hohenschaeftlarn; Julius Wittmann, Deisenhofen, both of Fed. Rep. of Germany

[73] Assignee: Siemens Aktiengesellschaft, Berlin & Munich, Fed. Rep. of Germany

[21] Appl. No.: 396,338

[22] Filed: Jul. 8, 1982

[30] Foreign Application Priority Data

Sep. 21, 1981 [DE] Fed. Rep. of Germany ........ 3137441

[51] Int. Cl.³ .............................................. B23K 27/00
[52] U.S. Cl. .............................................. 219/121 LD
[58] Field of Search ................ 219/121 LC, 121 LD, 219/121 EC, 121 ED

[56] References Cited

U.S. PATENT DOCUMENTS

| 3,217,088 | 11/1965 | Stererman | 219/121 LD X |
| 3,517,159 | 6/1970 | Milochevitch | 219/121 LC |
| 4,034,181 | 7/1977 | Packard | 219/121 LC X |
| 4,249,967 | 2/1981 | Liu et al. | 29/569 L |
| 4,278,867 | 7/1981 | Tan | 219/121 LC X |
| 4,281,236 | 7/1981 | Von Allmen et al. | 219/121 LC |

OTHER PUBLICATIONS

R. Tsu et al., IBM Technical Disclosure Bulletin, "New Type of Thin Film Hybrid Crystalline–Amorphous SiSolar Cell With High Light Absorption PIN Structure vol. 21, No. 11, Apr. 1979 pp. 4691.

*Primary Examiner*—C. L. Albritton

[57] ABSTRACT

A method for fastening optical and electro-optical components characterized by the component being fixed either individually to a base member or another component by being secured by laser welding. Preferably, the component is either secured directly to a weldable support member or to an intermediate carrier which in turn is connected to a weldable support member and the support member is then welded to a base member by the laser welding.

20 Claims, 4 Drawing Figures

METHOD FOR SECURING OPTICAL AND ELECTRO-OPTICAL COMPONENTS

BACKGROUND OF THE INVENTION

The present invention is directed to a method for securing components such as optical and electro-optical components together.

Up to the present, the fastening of components such as optical or electro-optical components together occurred by means of utilizing either mechanical clamps or by bonding. Due to the use of a manipulator which holds the parts in the desired position, these methods generally impose stresses on the components. Furthermore, when utilizing glue connections, care must be taken so that gases are not emitted which may injuriously effect the electro-optical components.

SUMMARY OF THE INVENTION

The present invention is directed to providing a method for fastening optical and electro-optical components in random positions or in aligned positions to one another without utilizing undesired adhesives. This object is achieved by a method of fastening optical and electro-optical components which method includes the steps of positioning a component in the desired position relative to a base member, and securing the components to the member by laser welding.

Preferably, the component is either secured directly on a weldable support member that is positioned and welded to the base member by laser pulses or is secured on an intermediate carrier that is secured to the support member which is then welded to the base member. The step of positioning the weldable support member and base member provides a gap therebetween which has a thickness in a range of 50 to 250 μm.

In order to prevent the heat of welding from being conducted towards the center of the weldable support member, the support member is preferably provided with means for forming a high resistance to heat conduction which means comprises either a melt nose or a hole. These weldable support members may be a metal support member and also the base member may be a metal member. However, the base member may be composed of silicon.

If an intermediate carrier is utilized, preferably it is a silicon disk, which is provided with V-shaped grooves such as by etching, to receive optical components such as light waveguides, laser diodes and optical miniature components.

The weldable support member should be formed of a material which has the slightest volume change during the welding operation and preferably the weldable support member and an intermediate carrier if used have comparable coefficients of thermal expansion.

DESCRIPTION OF THE PREFERRED EMBODIMENTS

Figure 1:
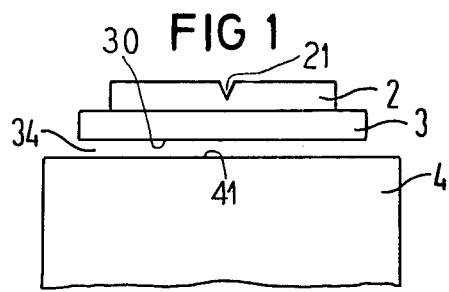
FIG. 1 is an end view showing the positioning of an intermediate carrier, a weldable support member with a base member in accordance with the method of the present invention.
Figure 2:
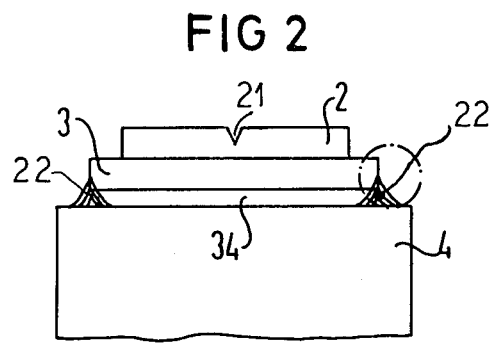
FIG. 2 illustrates the arrangement of FIG. 1 after welding.

According to the proposed method, optical and electro-optical components are fixed individually on a member or secured together by means of laser welding. To accomplish this method, the component to be attached is placed either directly on a support member 3 or on an intermediate carrier 2 which in turn is secured to the weldable support member 3. If an intermediate carrier 2 is utilized, it may be, for example, a silicon disk which may be provided with grooves such as by etching for receiving the component. The weldable support member 3 is preferably a metal material which has a low volume change during the welding operation, and, an example of this type of material is sold under the trade name Vacon. The weldable support member 3 in turn is welded to a metal base body or member 4. As illustrated in FIGS. 1 and 2, the support member 3 is positioned with a bottom surface 30 above a surface 41 of the body 4 with a gap 34 which has a thickness range of 50 μm to 250 μm. Prior to welding, adjustment between the members 3 and 4 in the plane of the gap 34 can be easily made.

The securing of the support member 3 to the body 4 is carried out by welding which welding step utilizes short laser pulses which melt material from the metal support member 3 in such a manner that the base body 4 and support member are connected to one another, for example, as illustrated at points 22 in FIG. 2. Preferably, the welds are carried out in at least three points.

Figures 3, 4:
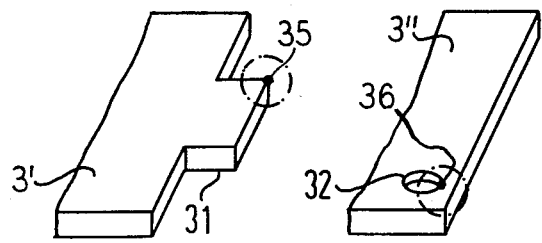
FIG. 3 is a partial perspective view of an embodiment of the member having a welding nose for a welding point.
FIG. 4 is a partial perspective view of a support member exhibiting a hole which provides a welding point.

The metal support member 3 may be designed to have means which provide high thermal resistance to the heat conduction from a point of welding toward the center of the support. This means can be formed as illustrated in FIG. 3 by a melt nose 31 which extends from an edge of the support member 3' to form a welding edge or point 35 or by providing a hole 32 adjacent a point 36 where the welding laser beam will be directed in the support member 3". Thus, the welding operation represents practically no mechanical loading for the manipulator and no thermal loading for the environment.

The intermediate carrier 2 is preferably a silicon disk, which has a groove 21 and serves as a carrier and fastening element for light waveguides, laser diodes, receiver diodes or optical miniature components. Each groove 21 is preferably manufactured by means of anisotropic etching. The metal support member is preferably of a material with a low volume change during the welding operation and particularly at the temperatures that are created. In addition, the member 3 has a thermal expansion coefficient which is comparable to the material of the intermediate carrier 2 and/or of the components.

Although various minor modifications may be suggested by those versed in the art, it should be understood that we wish to embody within the scope of the patent granted hereon, all such modifications as reasonably and properly come within the scope of our contribution to the art.

We claim:

1. A method for fastening optical and electro-optical components comprising the steps of positioning a component relative to a base member by providing a base member and a weldable support member, securing the component on the weldable support member, positioning the weldable support member relative to the base member and maintaining a gap between the support member and the base member; then laser-welding the weldable support member to the base member by means of laser pulses.

2. A method according to claim 1, wherein said step of maintaining a gap maintains a gap with a thickness in the range of 50 μm–250 μm.

3. A method according to claim 1, wherein the step of providing a weldable support member provides a weldable support member having means for resisting conduction of heat in the support towards the center thereof.

4. A method according to claim 3, wherein said means for resisting comprises providing a melt nose on an edge of said support member and conducting said laser welding at said melt nose.

5. A method according to claim 3, wherein said means for resisting comprises providing a hole adjacent the edge of the support member, and conducting said laser welding at said hole.

6. A method according to claim 1, wherein the step of providing a weldable support member and providing a base member provides at least one of said members as a metal member.

7. A method according to claim 1, wherein the step of positioning a component on said weldable support member includes providing an intermediate carrier, securing the component on the intermediate carrier and securing the intermediate carrier onto the weldable support member.

8. A method according to claim 7, wherein the step of providing the intermediate carrier provides a silicon disk.

9. A method according to claim 8, wherein the step of providing a silicon disk provides the silicon disk having a V-shaped groove for receiving the component and said step of securing the component on said intermediate carrier includes securing the component in the groove.

10. A method according to claim 9, wherein said step of securing a component in the groove comprises securing a component selected from a group consisting of light waveguides, laser diodes and miniature optical components.

11. A method according to claim 1, wherein the step of providing a support member provides a support member of a material having a slight volume change during a welding operation.

12. A method according to claim 1, wherein the step of providing a component includes securing the component on an intermediate carrier, wherein said step of securing the component includes securing the carrier on said weldable support member, and said intermediate carrier and weldable support member each being of materials with comparable coefficients of thermal expansion.

13. A method according to claim 1, wherein the step of providing a base member comprises providing a base member of silicon.

14. A method according to claim 1, wherein the step of securing by laser welding includes welding in at least three points.

15. A method for fastening optical and electro-optical components comprising the steps of positioning a component relative to a base member by providing a weldable support member having means for resisting conduction of heat in the support towards the center thereof, securing the component on the weldable support member and positioning the weldable support member relative to the base member; and then laser-welding the weldable support member to the base member by means of laser pulses.

16. A method according to claim 15, wherein said means for resisting comprises providing a melt nose on an edge of said support member and conducting said laser welding at said melt nose.

17. A method according to claim 15, wherein said means for resisting comprises providing a hole adjacent the edge of the support member, and conducting said laser welding at said hole.

18. A method for fastening optical and electro-optical components comprising the steps of positioning a component relative to a base member by providing a weldable support member and silicon disk, securing the component on the silicon disk, securing the silicon disk onto the weldable support member, and positioning the weldable support member relative to the base member; and then laser-welding the weldable support member to the base member by means of laser pulses.

19. A method according to claim 18, wherein the step of providing a silicon disk provides the silicon disk having a V-shaped groove for receiving the component and said step of securing the component on said silicon disk includes securing the component in the groove.

20. A method according to claim 19, wherein said step of securing a component in the groove comprises securing a component selected from a group consisting of light waveguides, laser diodes and miniature optical components.

* * * * *